United States Patent [19]

Köster et al.

[11] Patent Number: 4,660,126
[45] Date of Patent: Apr. 21, 1987

[54] FIRE-PREVENTIVE HOUSING FOR LINE DELAY MEASURING APPARATUS

[75] Inventors: Hans Köster, Gelsenkirchen; Horst Weiler, Bamberg, both of Fed. Rep. of Germany

[73] Assignee: Seba-Dynatronic, Mess - und Ortungstechnik GmbH, Baunach, Fed. Rep. of Germany

[21] Appl. No.: 678,631

[22] Filed: Dec. 6, 1984

[30] Foreign Application Priority Data

Dec. 7, 1983 [DE] Fed. Rep. of Germany ....... 3344311

[51] Int. Cl.$^4$ .......................... H05K 7/00; H05K 5/00
[52] U.S. Cl. .................................... 361/392; 361/380; 361/422; 174/52 PE; 324/156
[58] Field of Search ............. 324/156, 121 R; 73/431; 174/52 R, 52 PE; 361/334, 380, 422, 356, 358, 385, 393, 394, 331, 392

[56] References Cited

U.S. PATENT DOCUMENTS

| | | |
|---|---|---|
| 1,947,085 | 2/1934 | Hill et al. .......................... 174/52 PE |
| 2,898,585 | 8/1959 | Bauman ............................. 174/52 R |
| 3,061,779 | 10/1962 | Boswell et al. ...................... 324/156 |

Primary Examiner—Reinhard J. Eisenzopf
Assistant Examiner—Jack B. Harvey
Attorney, Agent, or Firm—Boniard I. Brown

[57] ABSTRACT

A fire-preventive and flame-proof housing for line delay measuring apparatus, the components including a high-tension voltage supply, a display tube and operating elements and indicator elements, comprises a first section defined within the housing in which are positioned components carrying relative low voltages and without significant fire hazard, a second section defined within the housing adjacent to the first section, wherein are positioned those of the components carrying high voltages, and such components as are otherwise intrinsically unsafe, the second section being hermetically sealed and filled with insulating material. The housing includes a front panel and a partition separating the first and second sections, a cover is detachably mounted on the housing and sealed relative thereto by a resilient sealing element about an aperture of the housing. Potentiometers for focus and intensity functions of the display tube are positioned in the second section, and a potentiometer spindle and selector switch spindles extend from the second section through the partition to the front panel, with sealing between the partition and the spindles and between the spindles and the front panel. The display tube face is preferably positioned in a partition opening, and a hermetically inset glass pane mounted on the front panel for viewing the tube from the front panel.

6 Claims, 4 Drawing Figures

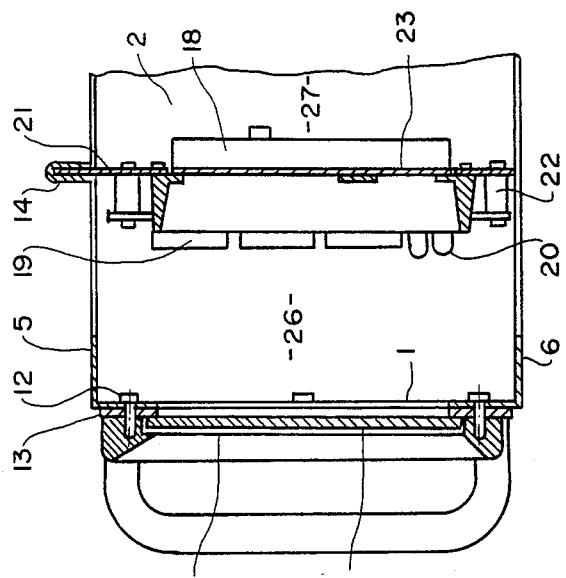
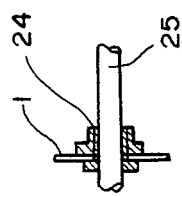
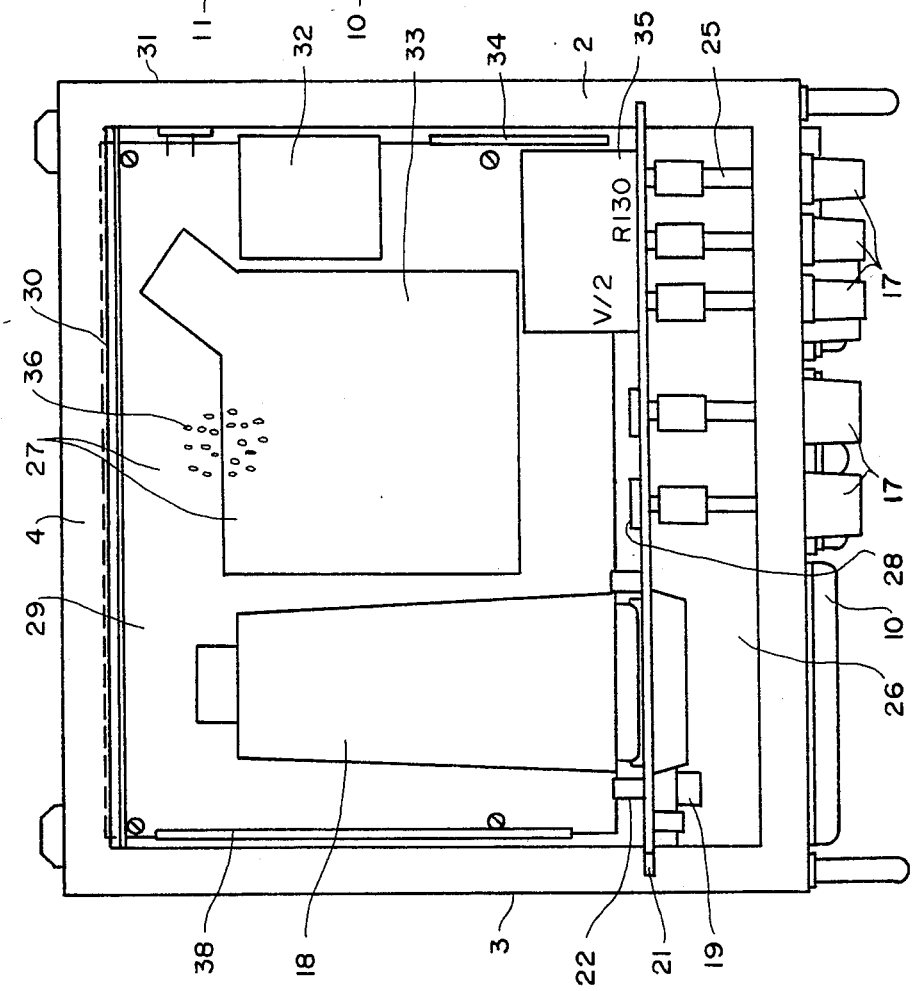
FIG. 2
FIG. 4
FIG. 3

FIRE-PREVENTIVE HOUSING FOR LINE DELAY MEASURING APPARATUS

BACKGROUND OF THE INVENTION

The invention relates to a measuring apparatus, in particular to a line delay measuring device, for location of cable faults in electrical cables, comprising a closed box-like housing and situated in the housing a voltage supply generating high tension which is applied to an image tube arranged within the housing, as well as operating elements arranged on the front board, such as switches, press buttons, indicator elements and connector sockets.

The high degree of mechanisation in mining operations requires a considerable utilisation of electrical cables and wiring. The preponderant reason for the breakdown of an electrical conductor is mechanical destruction. Sources of failure discovered in this connection were:
   erroneous length
   conductor breaks
   low-ohmic connections
   short-circuits
   irregularities caused by alteration of the structure, of the dielectric and the like.

Even in the case of intrinsically safe installations, the investment costs in respect of the cabling material are raised considerably with long-distance supplies and consequent requirement for high cable cross-sections. Furthermore, in the case of mining operations, standby conductors are kept in readiness so that a new cable line may be utilised immediately in case of breakdown of a conductor. Conductor sections which have been taken out of service because of defects which are not detectable from the outside, are normally, as a matter of principle, left in the drifts, after completion of the working operations in said drifts. It is also worth observing that the electrical departments of mines continuously employ operatives in overhauling and re-utilisation of disassembled cables and conductors. Use is made of conventional measuring apparatus such as ohm meters and transit flow testers, for this purpose, and a reutilisation of the whole cable section is abandoned in the case of cable defects which are not detectable by means of the measuring instruments specified, or if no external damage is visible.

SUMMARY OF THE INVENTION

The present invention consequently is directed to the problem of developing a measuring apparatus for detection of cable defects of the nature defined in the foregoing, in such a manner that it is utilisable for underground operations.

For resolution of the problem posed, the invention is characterised in that the housing of the measuring instrument is constructed in an intrinsically safe and flameproof manner by dividing the internal volume into at least two separate sections by means of a partition, of which one section adjacent to the front panel is organised as an intrinsically safe section wherein are installed operating and indicating elements carrying low voltage, and the other section distal from the front panel and situated beyond the partition is organised as a specially protected space wherein are situated a display tube and parts carrying high voltage as well as circuits which are not intrinsically safe, and that this section is filled with quartz granulate.

A line delay measuring instrument utilising digital indication is applied for location of cable defects. It is too costly however to construct the measuring apparatus as a whole in an intrinsically safe form, because of the display tube incorporated requiring high tension. The electrical supply is provided by means of a rechargeable battery disposed in the other, distal section.

Establishing the location of a cable defect is performed by the pulse-echo method, the distance from the mensuration point to the defect location being the product of the pulse duration multiplied by half the speed of pulse propagation. A pulse fed into a cable is reflected if the characteristic impedance of the cable incurs a change at some point. If the pulse velocity of the cable is known, it is possible to calculate the distance from the point of reflection, from the duration of the pulse. After input of the pulse velocity characteristic for the cable, the measuring apparatus automatically multiplies this by the duration measured, and indicates the distance of the defect from the start of the cable digitally, in metres. The defects listed in particular may subsequently be located by means of the cable defect location apparatus:
   location of a broken wire,
   short circuits,
   low-ohmic shunts,
   location of a damp cable section,
   location of junctions,
   length defects,
   loading inductances,
   line capacitors,
   interrupted or open metal casing,
   interruption or short-circuit in the cable comprising 2 insulations.

The invention incorporates the following features, so that this measuring technique may be applied in underground mining:
1. Construction of a sheet steel housing,
2. Division of the housing into two chambers, forming an intrinsically safe and a specially protected section.
3. Potentiometers for high voltages (focus, intensity) are installed internally and are then not directly accessible from the outside,
4. spindles of potentiometers and of rotary selectors for the pulse velocity (V/2) are extended by plastics material spindles and led to the outside through the intrinsically safe housing chamber via special bushings,
5. the operating keyboards are replaced by miniature relays which are operated via an intrinsically safe circuit by means of press button keys, the position of the press button keys being indicated by light-emitting diodes,
6. the rotary selector position for the pulse velocity is indicated digitally,
7. battery monitoring by means of LED indication,
8. digital display and light-emitting diodes for accumulator monitoring are situated behind a fused silica pane within the intrinsically safe space, whereas the display tube is situated in the specially protected chamber filled with quartz granulate.
9. the housing screws are recessed and covered by casting compound.

The measuring apparatus as a whole is thus constructed as a working device protected against firedamp in the protective category (SCH)s,i.

The parts on which igniting sparks, discharge arcs or dangerous temperatures may occur, should be protected in a manner such as to prevent an ignition or the propagation of an explosion to ambient firedamp (BVOE Art.8, para. 1f).

The following structural conditions were established for the constructive embodiment of the features specified under numbers 1 to 9:

The electronic system is installed within a sheet steel housing—no static charge, high mechanical strength—and complies to at least the required protective specification IP 54 according to DIN 40050. The housing screws are recessed and covered by casting compound to prevent the housing being opened without tools designed for this purpose (BVOE Art.9).

The internal volume of the housing is divided into two chambers: one in which the special protection is provided by filling with glass beads ($\phi < 1.6$ mms), and the other in which are situated the press button keys, the digital display for setting half the pulse velocity V/2 and the LED display for battery monitoring, which are all supplied via intrinsically safe circuits (limitation by means of voltage regulators and complementarily by sufficiently high limiting resistances).

The switching operations of the press button keys which are not intrinsically safe are performed by means of miniature relays situated in the specially protected section. The switching current for the relays is limited to the requirements of intrinsic safety by means of two diodes connected in parallel with the relays in each case. The switching position of the press button keys is indicated by light-emitting diodes.

A high voltage of say 800 volts is applied in each case to the potentiometers for focus and intensity, which cannot be restricted to intrinsically safe circuits without loss of functional effectiveness. For this reason, the potentiometers are installed internally and lined up in optimum manner once and for all. The circuits of the potentiometers of importance for location of defects are converted to the intrinsic safety condition by current limitations. The setting spindles are moreover extended by means of non-conductive plastics material spindles and led to the outside through the intrinsically safe chamber by means of special bushings.

Since coding contactors for setting half the pulse velocity V/2 do not comply with protective specification IP 54, use is made of rotary selector switches which are equally supplied via intrinsically safe circuits and are extended to the outside to the operating button via plastics material spindles. The switch settings are evaluated by means of a logic system and shown by an LED display.

For this purpose of more satisfactory and more precise readings, the battery capacity monitored is indicated by light-emitting diodes. The light-emitting diodes for battery monitoring, the digital display for V/2 setting, the digital display for the cable defect distance and the picture tube, are situated behind a pane of laminated glass. This is necessary to protect the picture tube against mechanical damage.

The object of the present invention emerges not only from the object of the individual claims but also from the combination with one another of the individual claims. All the data and features disclosed in these papers, in particular the spatial form illustrated in the drawings, are claimed as being essential to the invention inasmuch as they are novel by themselves or combined with one another, regarding the prior art.

BRIEF DESCRIPTION OF THE DRAWINGS

FIG. 2 shows a cross-section along the line II—II through a front part of the measuring apparatus, FIG. 3 shows a plan view of the measuring apparatus according to FIG. 1, with a housing cover removed, FIG. 4 is a fragmentary view showing the traversal of the front panel by the potentiometer spindles.

DESCRIPTION OF THE PREFERRED EMBODIMENT

Figure 1:
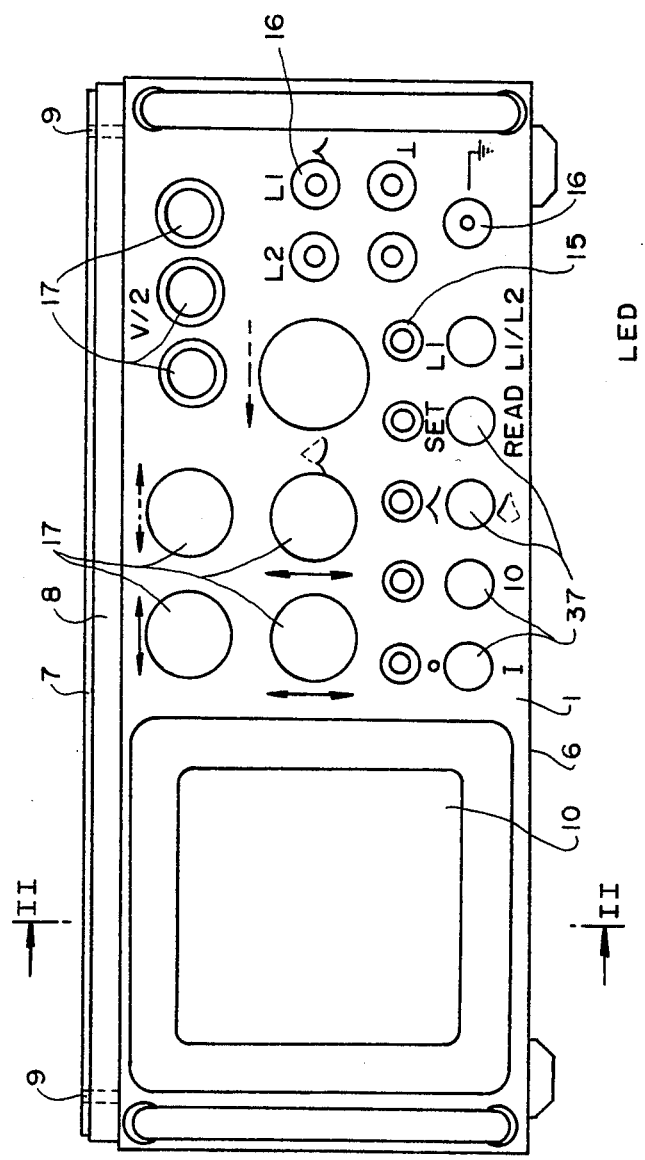
FIG. 1 shows a front view of measuring apparatus.

The housing shown in FIGS. 1 to 3 comprises a front panel 1, two side panels 2,3 laterally contiguous to the former and extending parallel to each other, as well as a rear panel 4, a cover panel 5 and a base panel 6.

The housing is closed off at the top by a housing cover 7 which hermetically seals off the interior of the housing from the ambient atmosphere by means of a circumferential rubber seal 8 and screws 9 arranged in a recessed and casting composition-covered manner.

According to FIG. 1, a glass pane 10 of safety glass is installed in the front panel 1. According to FIG. 2, the glass pane 10 is seated in a circumferential rubber seal 11 and is screwed in a sealed manner to the front panel 1 of the housing on the front side of the housing by means of screws 12 which are again sealed off by means of rubber seals 13.

Secured in the front panel are rotary selector switches 17 for digital input of half the pulse velocity, as well as potentiometers 17 for setting the positions of the screen image of the picture tube 18 and for varying the amplification in the Y direction as well as for stepless expansion of the screen image in the X direction.

Press button keys 37 of which the switching position is shown by superjacently situated LED displays 15 are installed on the front panel 1. In addition, plug sockets 16 for insertion of measuring leads are situated on the front panel 1.

In accordance with the invention, the internal volume of the housing is organised as two separate sections, namely a first intrinsically safe section 26 adjacent to the front panel and situated behind the front panel 1, and a second specially protected section 27 situated beyond the partition 21 and distal from the front panel 1.

As described in the foregoing, the intrinsic safety of the operating and indicating elements situated within the intrinsically safe section 26 and secured to the front panel 1, is obtained by the fact that their circuits are equipped with appropriate current limiting means and carry low voltage only.

The circuits carrying high voltage and the other circuits which are not intrinsically safe are situated in the specially protected section 27.

Importantly the press button keys 37 are merely supplied with low voltage, and this low voltage is conducted to miniature relays situated in the specially protected section 27, which are switched thereby and consequently control the functions of the display tube and the other operating functions.

To this end, the partition 21 extends throughout the internal height of the housing and is provided with a lip-shaped rubber seal 14 in accordance with FIG. 2, so that the top part of the rubber seal 14 bears sealingly against the underside of the housing cover 7.

An aperture is formed in the partition 21 for the front side of the display tube 18 which is connected hermetically and solidly to the partition in this area by means of spacing sleeves 22 and of appropriate fastening screws. Miniature bulbs 20 for indication of the operating condition of the apparatus and for indication of the state of battery charge are also arranged on the front side (in the intrinsically safe section 26), as also are numeric displays 19 whereby it is possible to obtain readings for different results of the cable defect measuring operation.

The front side of the picture tube 18 is equipped with a grid panel 23 of plastics material.

All the optical display elements, inclusive of the picture tube, may be observed in the direction from the front panel 1 of the housing via the glass pane 10 situated in the front panel.

According to FIGS. 3 and 4, the rotary knobs 17 have fitted to them non-conductive plastics material spindles 25 which pass through the intrinsically safe section 26 and which are coupled to the potentiometers 28 installed on the partition 21.

The plastics material spindles 25 are led through sealing glands 24 in the front panel 1 and comply with IP 54.

The other circuits of the measuring apparatus are installed in the second specially protected section which is filled with a quartz granulate insulating material 36 to increase the insulating capacity. A voltage supply 30 is secured parallel to the rear panel 4, whereas a base board 29 is arranged parallel to the base panel 6. A logic system board 38 which takes over calculating operations and control functions is arranged parallel to the side panel 3. Primarily the picture tube 18 carrying high voltage is installed in the specially protected section 27, as are a charging connector 31, a charging transformer 32, a chargeable battery 33 and a charging unit 34. The three rotary selector switches 17 situated at the right-hand side of the front panel act on a multipleswitch 35, said rotary selectors having been described above.

Thus there has been shown and described a novel fire-preventive housing for line delay measuring apparatus which fulfills all the objects and advantages sought therefor. Many changes, modifications, variations and other uses and applications of the subject invention will, however, become apparent to those skilled in the art after considering this specification together with the accompanying drawings and claims. All such changes, modifications, variations and other uses and applications which do not depart from the spirit and scope of the invention are deemed to be covered by the invention which is limited only by the claims which follow.

The inventor claims:

1. A fire-preventive and flame-proof housing for line delay measuring apparatus having components comprising a high-tension voltage supply, a display tube, operating elements and indicator elements, said housing comprising:
   means defining a first section within the housing wherein are positioned those of said components carrying relatively low voltages and presenting no significant hazard of fire,
   means defining a second section within the housing adjacent to the first section, wherein are positioned those components carrying high voltages and such components as are otherwise intrinsically unsafe, said second section being hermetically sealed,
   said second section being filled with an insulating material,
   a front panel on the housing,
   a partition separating the first and second sections, the second section being distal from the front panel,
   a potentiometer spindle and rotary selector switch spindles extending to said front panel from the second section through the partition, said spindles being formed of non-conductive plastic material,
   seal means between the partition and the spindles, said spindles extending into said second section and extending through said seal means to the front panel, and
   seal means between said spindles and the front panel.

2. A fire-preventive housing according to claim 1, and further including:
   a cover detachably mounted on the housing, and
   resilient sealing means between the cover and the housing about an aperture of the housing.

3. A fire-preventive housing according to claim 1, and further including:
   externally accessible fasteners, said fasteners being recessed and covered by a casting compound.

4. A fire-preventive housing according to claim 1, wherein:
   potentiometers for focus and intensity functions of the display tube are positioned in said second section.

5. A fire-preventive housing according to claim 1, and further including:
   operating buttons on the front panel for intrinsically safe circuits, acting on miniature relays positioned in the second section to control the function of the measuring apparatus.

6. A fire-preventive housing according to claim 1, wherein:
   the display tube has a face positioned in an opening in said partition, and further including:
   a hermetically inset glass pane mounted on the housing front panel for viewing the display tube from the front panel.

* * * * *